United States Patent
Okada et al.

[11] Patent Number: 5,931,627
[45] Date of Patent: Aug. 3, 1999

[54] WAFER TRANSPORT APPARATUS THAT CAN TRANSFER MULTIPLE WAFERS IN A SHORT PERIOD OF TIME

[75] Inventors: Keiji Okada, Shusou-gun; Katsuhiro Taniguchi, Toyo, both of Japan

[73] Assignee: Sumitomo Eaton Nova Corporation, Tokyo, Japan

[21] Appl. No.: 08/997,235

[22] Filed: Dec. 23, 1997

[30] Foreign Application Priority Data

Dec. 25, 1996 [JP] Japan .................................. 8-345791

[51] Int. Cl.⁶ ........................................ B65G 1/06
[52] U.S. Cl. ........................ 414/331; 414/416; 414/937
[58] Field of Search .......................... 414/416, 331, 414/937, 939, 217

[56] References Cited

U.S. PATENT DOCUMENTS

| | | | |
|---|---|---|---|
| 4,550,242 | 10/1985 | Uehara et al. | 414/937 X |
| 5,221,201 | 6/1993 | Yamaga et al. | 414/937 X |
| 5,615,988 | 4/1997 | Wiesler et al. | 414/937 X |
| 5,647,626 | 7/1997 | Chen et al. | 414/937 X |
| 5,664,925 | 9/1997 | Muka et al. | 414/937 X |
| 5,711,646 | 1/1998 | Ueda et al. | 414/937 X |

FOREIGN PATENT DOCUMENTS

| | | |
|---|---|---|
| 0 381 338 | 8/1990 | European Pat. Off. . |
| 3-154791 | 7/1991 | Japan . |
| 2317052 | 3/1998 | United Kingdom . |

OTHER PUBLICATIONS

Patent Abstracts of Japan, vol. 17, No. 160 (E–1342), Mar. 29, 1993, p. 76, JP 4–322444.

*Primary Examiner*—David A. Bucci
*Attorney, Agent, or Firm*—Burns, Doane, Swecker & Mathis, LLP

[57] ABSTRACT

A wafer transport apparatus comprises a wafer loading shuttle unit 30 and a wafer unloading shuttle unit 40, positioned on both sides of vacuum cassettes 20 provided in batch processing ion implantation equipment. Each shuttle unit has shuttle cassettes 31, 41 having wafer supports corresponding to wafer holding racks. Each shuttle cassette is configured so that movement between a transfer position for transferring wafers to and from the cassette unit and a standby position is possible. The wafer holding racks support the wafers at a central area thereof. The wafer supports support the wafer on both sides along the diameter of the wafer at points away from the central area.

6 Claims, 13 Drawing Sheets

WAFER TRANSPORT APPARATUS THAT CAN TRANSFER MULTIPLE WAFERS IN A SHORT PERIOD OF TIME

BACKGROUND OF THE INVENTION

The present invention relates to a wafer transport apparatus that can transfer multiple semiconductor wafers (wafers in the following) between wafer holding racks with multiple positions all at once, and in particular, it relates to a wafer transport apparatus suitable for a cassette unit provided for a batch processing ion implantation equipment.

In a batch processing ion implantation equipment, ion implantation is carried out simultaneously on multiple wafers in a vacuum chamber. Thus, a cassette unit is set up to introduce and remove the multiple wafers from the air and vacuum. This cassette unit is outside of the vacuum chamber, which is the processing chamber, when ion implantation processes are being carried out. When ion implantation processing is completed, the cassette unit is set in the vacuum chamber, and along with receiving processed wafers, it takes away unprocessed wafers. After taking them away, the cassette unit is removed from the vacuum chamber, and ion implantation processing recommences. The cassette unit, which has been removed from the vacuum chamber, has processed wafers unloaded one at a time by a handling unit and transferred to an unloading cassette, and along with this, unprocessed wafers are transferred one at a time from a loading cassette.

If the ion implantation processing has been completed at this time, the cassette unit is again set in the vacuum chamber, and the above operations are repeated.

As can be seen from the above explanation, in the ion implantation equipment up to this point, transfers between the cassette unit and the unloading cassette and the cassette unit and the loading cassette are carried out one wafer at a time. Therefore, a great deal of time is necessary for transferring all of the wafers from one cassette. This means that when the ion implantation processing time is short, the capacity for processing wafers per unit time is low.

SUMMARY OF THE INVENTION

Therefore, an object of the present invention is to provide a wafer transport apparatus that reduces time duration to exchange processed wafers and unprocessed wafers.

A wafer transport apparatus according to the present invention transfers wafers all at once to and from wafer holding racks in a wafer cassette provided in ion implantation equipment for batch processing. The wafer transport apparatus includes shuttle units for loading the wafers and those for unloading them, the loading and unloading shuttle units are arranged with the cassette units therebetween. Each of the shuttle units is equipped with shuttle cassettes, each with wafer supports corresponding to the wafer holding racks. Each of the shuttle cassettes is configured so that movement between a transfer position for transferring wafers to and from the cassette unit and a standby position is possible. The wafer holding racks support the wafers in a central area of the wafer. Each of the wafer support supports the wafer on both sides along the diameter of the wafer at points away from the central area.

DESCRIPTION OF THE PREFERRED EMBODIMENTS

Referring to FIGS. 1–4, a wafer transport unit using a desirable implementation example for the present invention is described. In this example, the wafer transport unit for ion implantation equipment for batch processing of thirteen 12-inch wafers is used.

Figure 1:
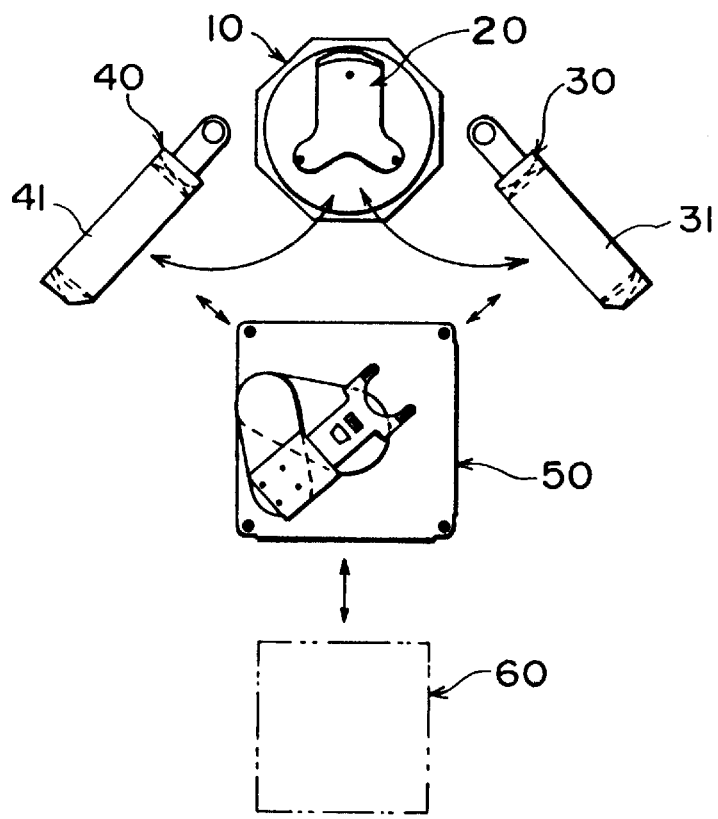
FIG. 1 is a plan view showing positional relationship between a wafer transport apparatus according to the present invention and a vacuum chamber in an ion implantation equipment.

In FIG. 1, the wafer transport unit is used for transferring the multiple wafers all at once to and from the cassette unit (in the following called vacuum cassettes for convenience) 20 provided for the vacuum chamber 10 in the batch processing ion implantation equipment. Concretely, the wafer transport unit is used for transferring the wafers of thirteen in number to and from the racks of thirteen stages in number in the vacuum cassette 20 all at once. The wafer transport unit includes the wafer loading shuttle unit 30 and the wafer unloading shuttle unit 40 for the vacuum cassette 20. However, only part of vacuum chamber 10 is shown.

As will be discussed later, the shuttle units 30 and 40 are equipped with shuttle cassettes 31 and 41, respectively, each with wafer supports of thirteen corresponding to the wafer holding racks of thirteen stages. Each of the shuttle cassettes, 31 and 40, is configured so that rotational motion between the transfer position for transferring wafers to and from the vacuum cassette 20 and the standby position shown in the figure is possible.

Furthermore, the wafer transport unit is equipped with a handling unit 50. The handling unit 50 removes the unprocessed wafers of thirteen one at a time from the wafer cassette unit 60 and transfers them to the wafer loading shuttle 30 in the standby position. In addition, the handling unit 50 receives the processed wafers of thirteen one at a time from the unloading shuttle unit 40 in the standby position and transfers them to the wafer cassette unit 60.

Figure 3:
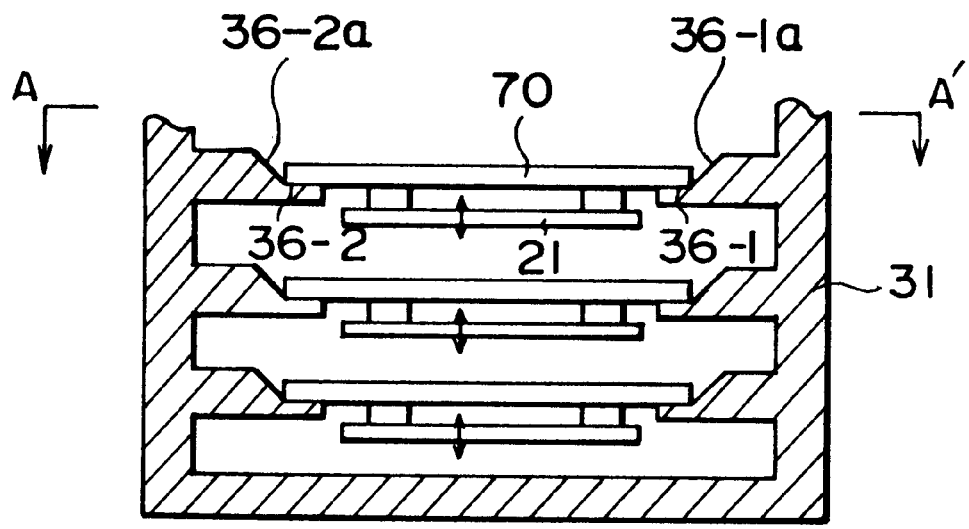
FIG. 3 is a view for use in describing relationship between wafer holding racks of a vacuum cassette and wafer supports of a shuttle cassette shown in FIG. 1.
Figure 6:
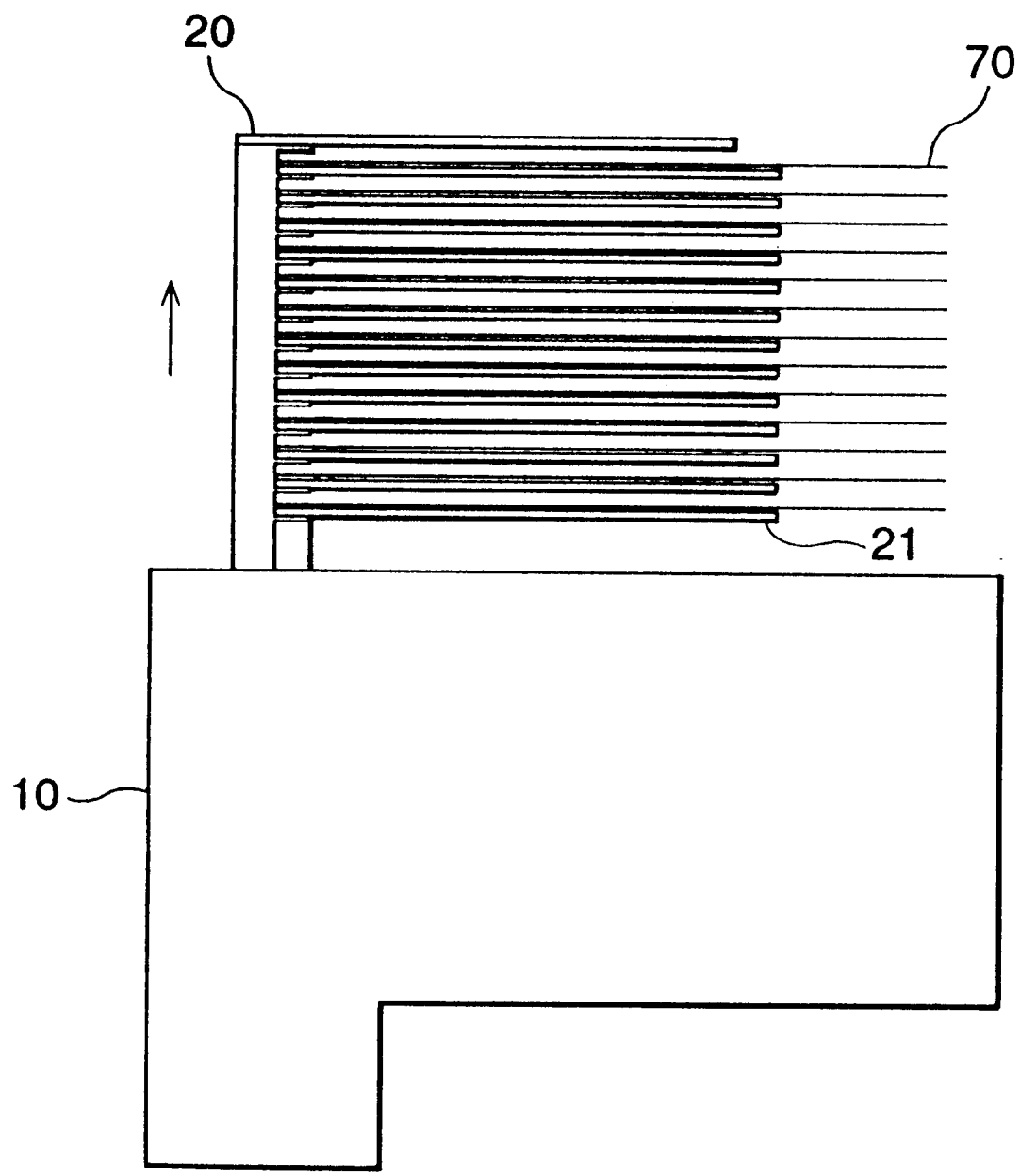
FIG. 6 is a view for use in describing the operation of a vacuum cassette that is associated with the first step in FIG. 5.

The entire vacuum cassette 20 is shown in FIG. 6, and an enlarged portion of it is shown in FIG. 3. The vacuum cassette 20 is equipped with wafer holding racks 21 of thirteen. The wafer holding racks 21 support the wafers 70 at multiple points in the central area. The vacuum cassette 20 is set up to freely enter and exit the vacuum chamber 10. The transferring of multiple wafers 70 is carried out with the vacuum cassette 20 removed from the vacuum chamber 10 as shown in FIG. 6.

Figure 2:
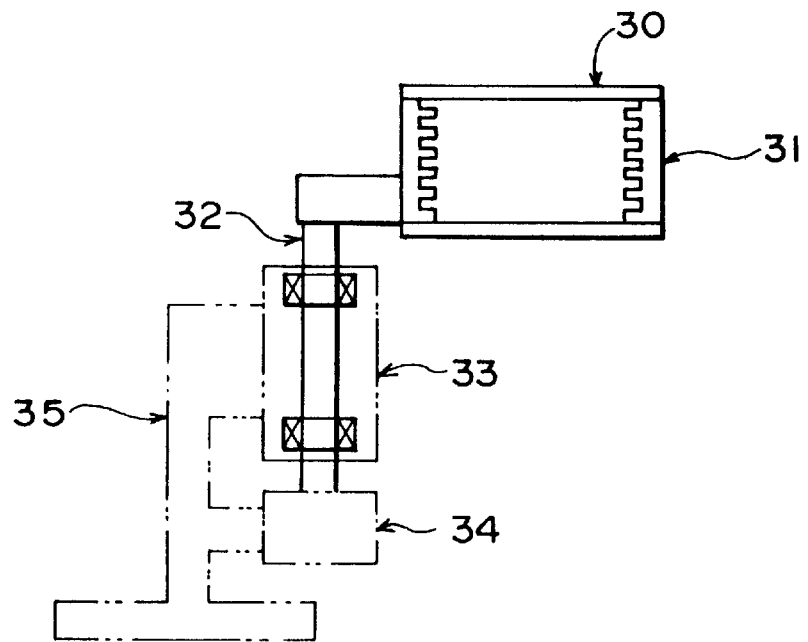
FIG. 2 is a schematic representation of a shuttle cassette for loading wafers illustrated in FIG. 1.

Referring to FIG. 2, the wafer loading shuttle unit 30 comprises the shuttle cassette 31, a shaft 32, a bearing unit 33, a rotational drive unit 34 and a support 35. The shuttle cassette 31 is attached to the upper end of the shaft 32. The shaft 32 is supported by the bearing unit 33 so it can be rotated. The rotational drive unit 34 rotates the shaft 32. The bearing unit 33 and the rotational drive unit 34 are fixed by the support 35.

Figure 4:
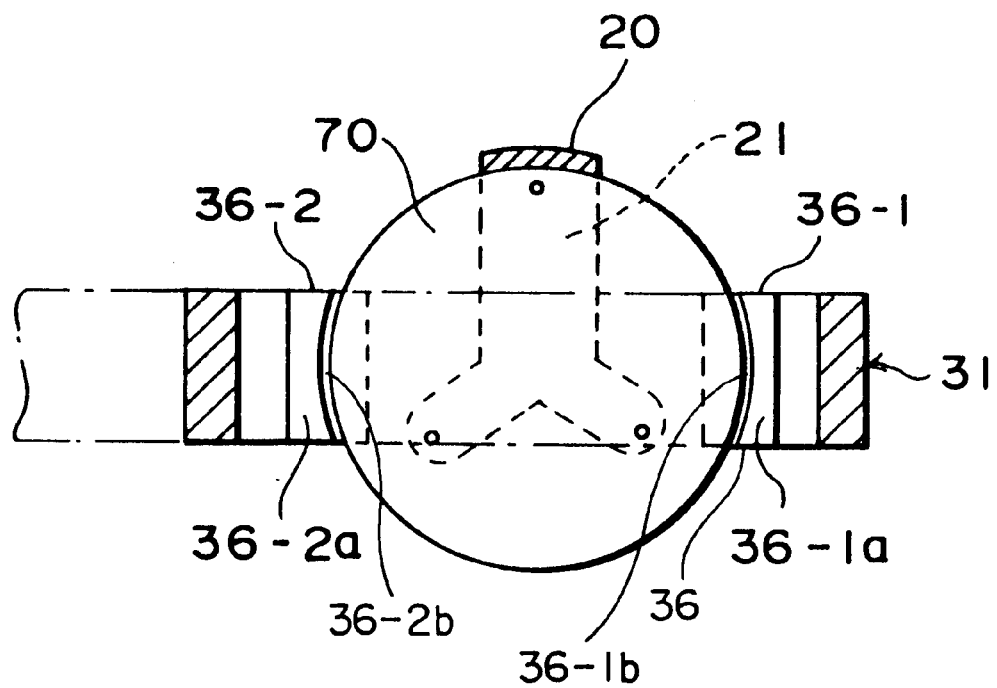
FIG. 4 is a cross-sectional view taken on line A–A' in FIG. 3.

As is shown in FIGS. 3 and 4, the shuttle cassette 31 has wafer supports 36 of thirteen. Each wafer support 36 supports a wafer 70 at locations separated from the above described central area (that is supported by the wafer holding rack 21) on both sides along the diameter. Thus, each wafer support 36 has receptions 36-1 and 36-2 in two positions corresponding to positions separated from the above mentioned central area on both sides along the diameter of the wafer 70. This is so that the wafer supports 36 of thirteen and the wafer holding racks 21 of thirteen do not interfere with each other when the shuttle cassette 31 comes into the transfer position.

Furthermore, the receptions 36-1 and 36-2 have tapered surfaces 36-1a and 36-2a that incline downward from the outside to the inside of the diameter of the wafer 70. Furthermore, the receptions 36-1 and 36-2 have flat circular arc sections 36-1b and 36-2b, which correspond to the carrying area of the wafer 70, next to the tapered surfaces 36-1a and 36-2a. By this means, central positioning of the wafer 70 is carried out just by loading the wafer 70 on the receptions 36-1 and 36-2.

As will be explained later, the holding racks 21 of thirteen in the vacuum cassette 20 are configured so they can move freely only a predetermined fixed distance up and down. When unprocessed wafers of thirteen are transferred to the vacuum cassette 20 from the wafer loading shuttle unit 30 all at once, the wafer holding racks 21 of thirteen are in a position moved downward just the above-mentioned predetermined fixed distance. If, in this state, the wafer supports 36 of thirteen come to the above-mentioned receiving position, the wafer holding racks 21 of thirteen can be raised just the above-mentioned predetermined fixed distance and take the unprocessed wafers of thirteen all at once. Thus, the shuttle cassette 31 can transfer the wafers 70 (unprocessed) of thirteen for the vacuum cassette 20 all at once.

Since the above structure is exactly the same for the wafer unloading shuttle 40, the diagrammatic explanations are left out here. Put simply, when multiple processed wafers are transferred to the shuttle unit 40 from the vacuum cassette 20 in a batch, the wafer holding racks 21 of thirteen are positioned by being moved up just the above-mentioned predetermined fixed distance. In this state, when the wafer supports of thirteen come to the above-mentioned transfer position, the processed wafers of thirteen can be transferred to the wafer supports of thirteen all at once by just lowering the wafer holding racks 21 of thirteen by the above-mentioned predetermined fixed distance.

However, in terms of the handling unit 50 has been clearly shown in, for example, Japanese Patent Laid-Open (JP-A) No. 03-154791, and diagrams and explanations will be left out here.

Next, the order of the operation in the wafer transport apparatus is described.

Figure 5:
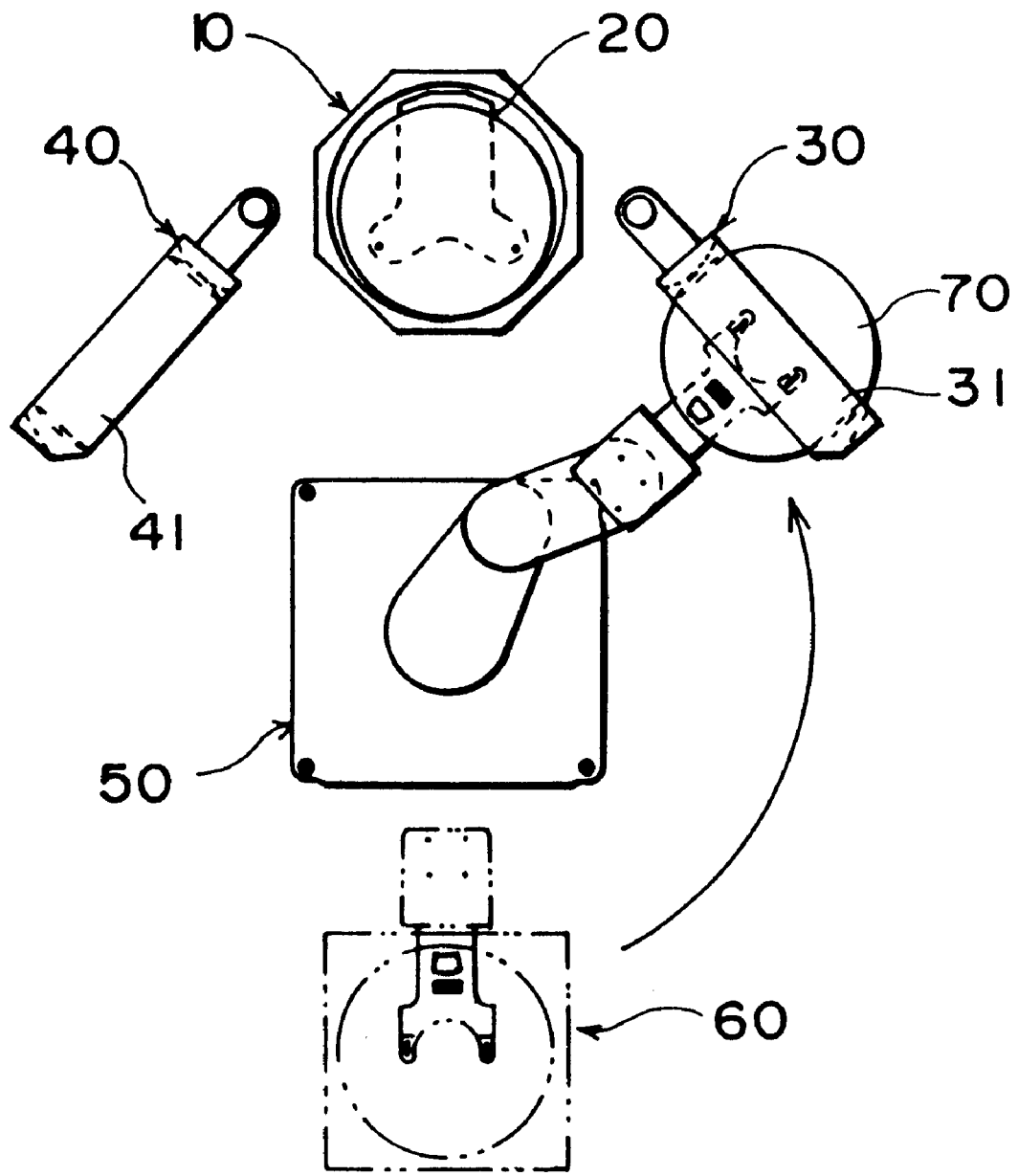
FIG. 5 is a view for use in describing a first step of the operation of the wafer transport apparatus according to the present invention.

As shown in FIG. 5, the unprocessed wafers 70 of thirteen are put into the loading shuttle 31 by the handling unit 50, and the shuttle cassette 31 is placed on standby.

As shown in FIG. 6, when the ion processing is completed in the vacuum chamber 10, the vacuum cassette 20 in which the processed wafers 70 of thirteen have been replaced is pushed out of the vacuum chamber 10.

Figure 7:
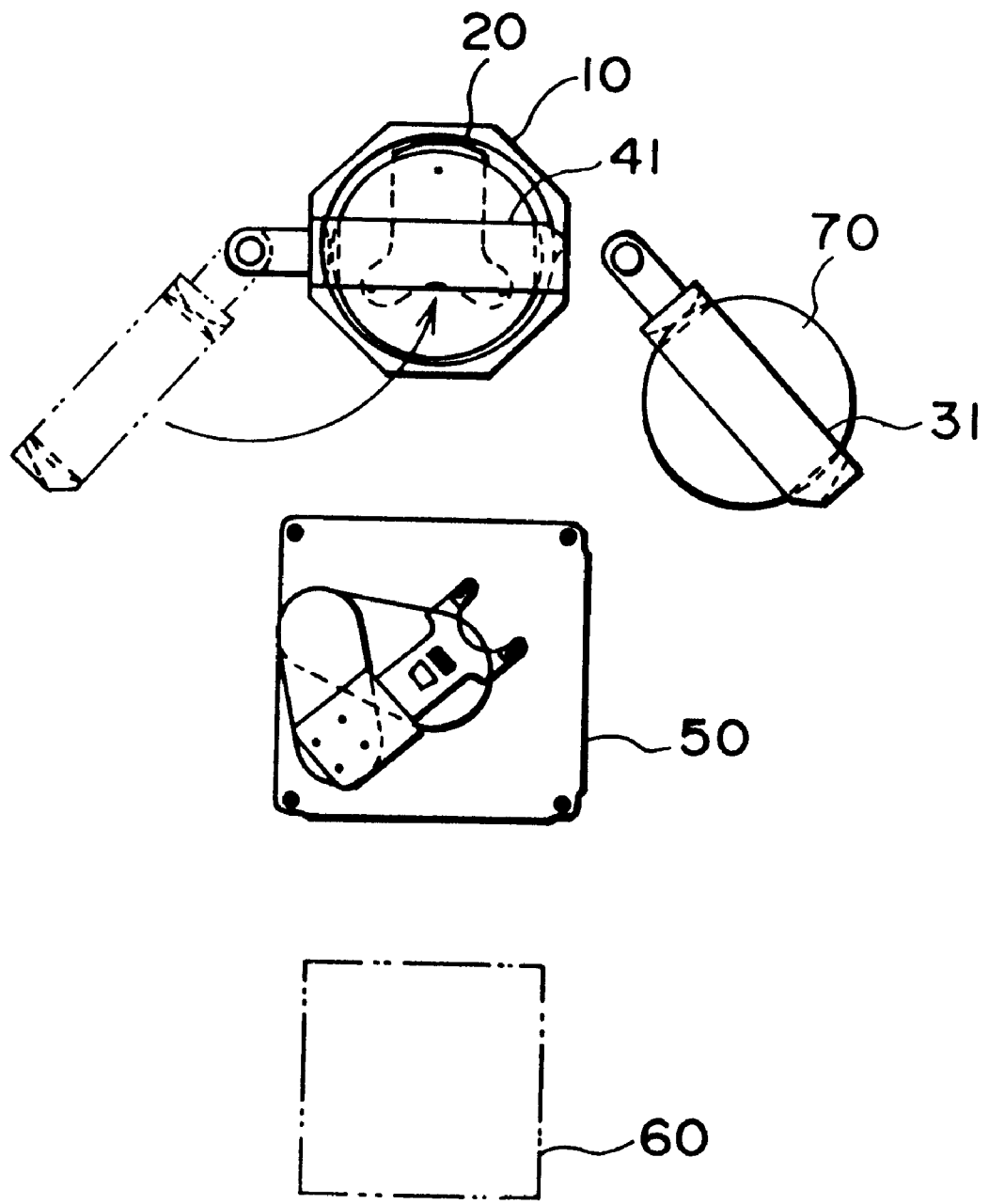
FIG. 7 is a view for use in describing a second step of the operation of the wafer transport apparatus according to the present invention.

As shown in FIG. 7, the unloading shuttle cassette 41 is moved into the transfer position to receive the processed wafers 70 of thirteen.

Figure 8:
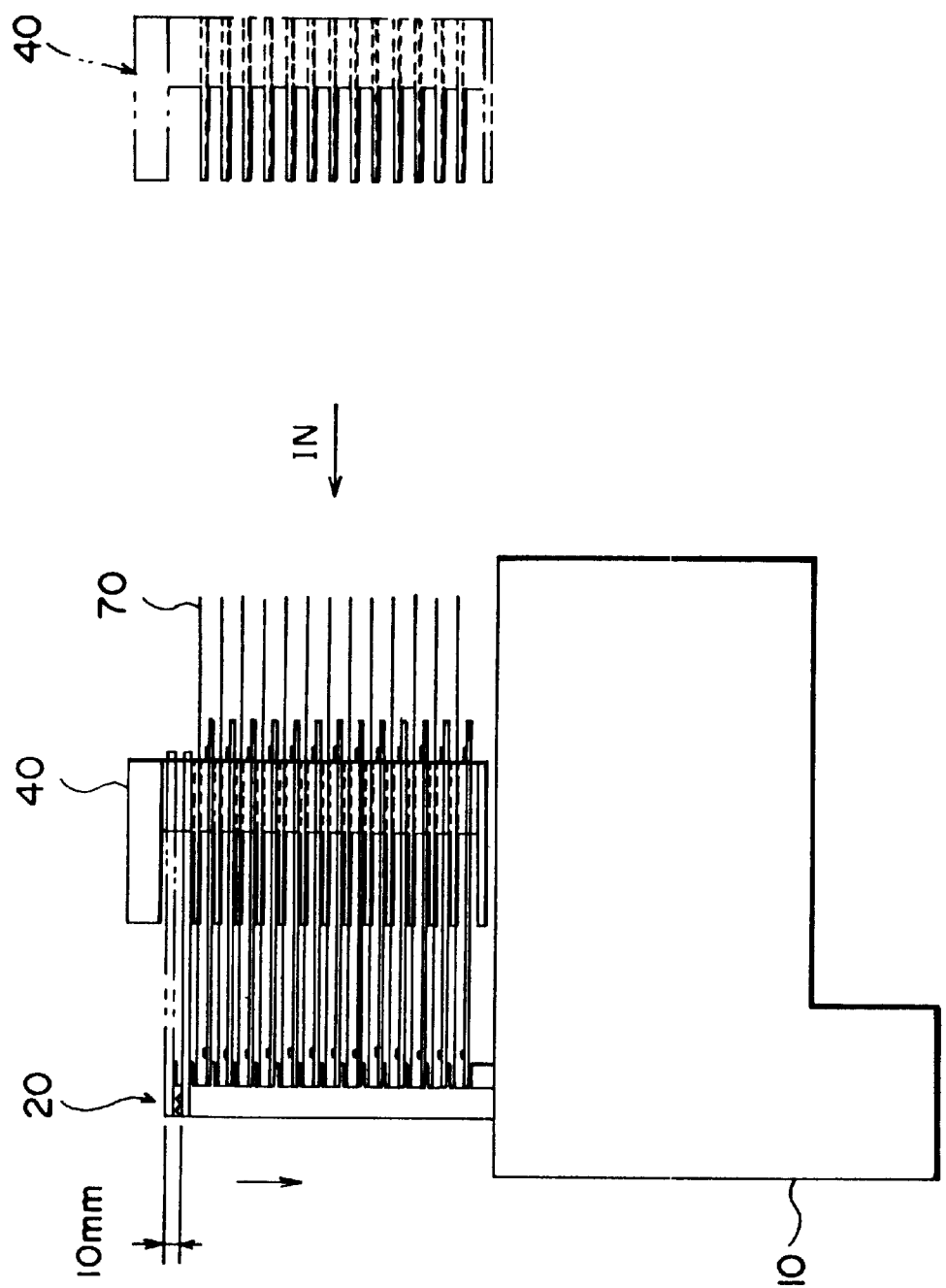
FIG. 8 is a view for use in describing the operation of the vacuum cassette that is associated with the second step in FIG. 7.

As shown in FIG. 8, when the vacuum cassette 20 is lowered a predetermined fixed distance (10 mm here), the processed wafers 70 of thirteen are transferred to the unloading shuttle cassette 41.

Figure 9:
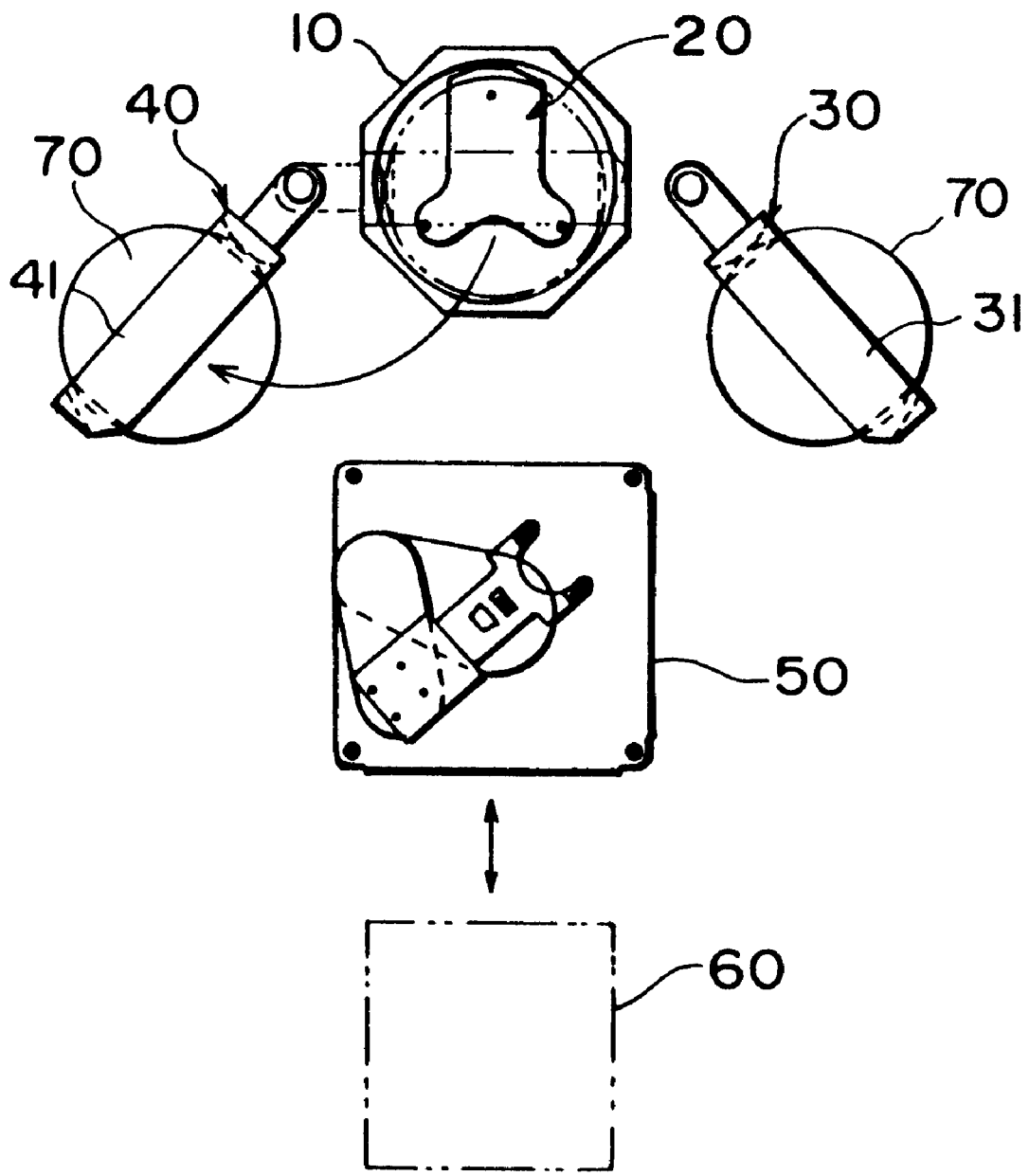
FIG. 9 is a view for use in describing a third step of the operation of the wafer transport apparatus according to the present invention.

As shown in FIG. 9, the unloading shuttle cassette 41 returns to the original standby position when the processed wafers 70 of thirteen have been received. Thus, the processed wafers 70 of thirteen are taken out of the vacuum cassette 20 all at once.

Figure 10:
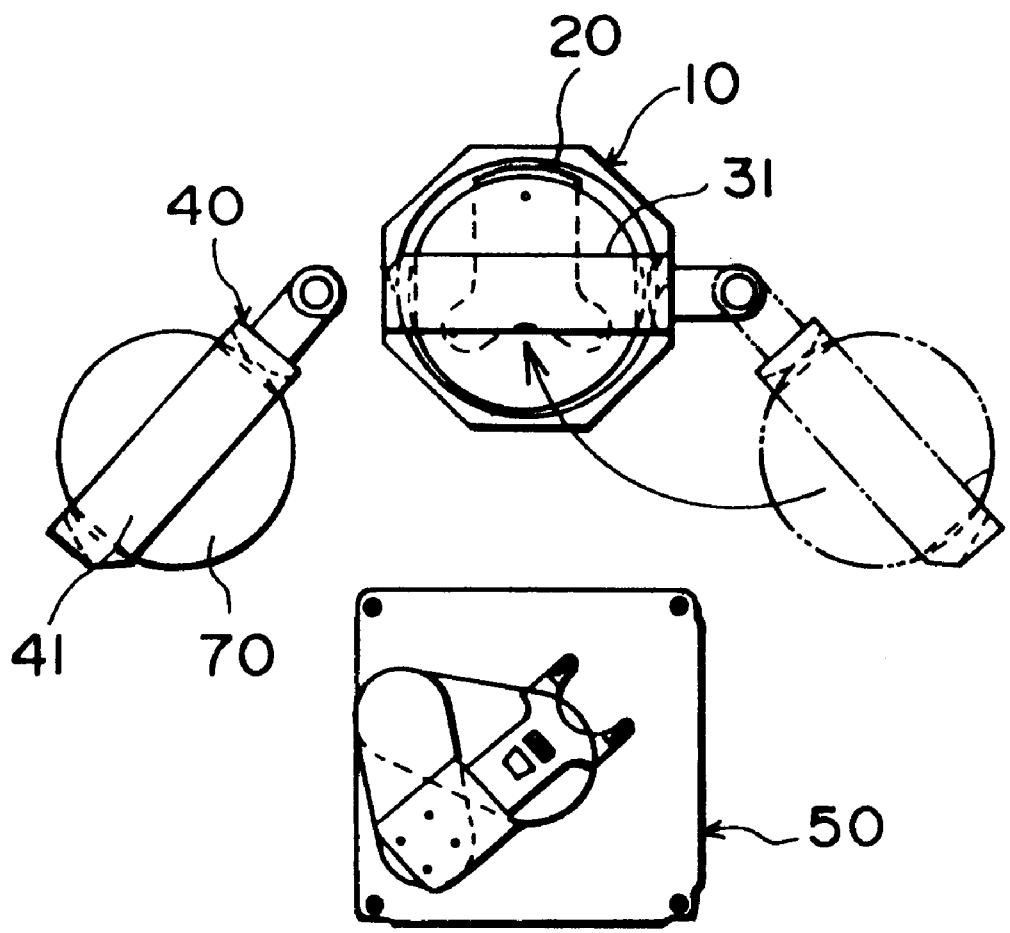
FIG. 10 is a view for use in describing a fourth step of the operation of the wafer transport apparatus according to the present invention.
Figure 11:
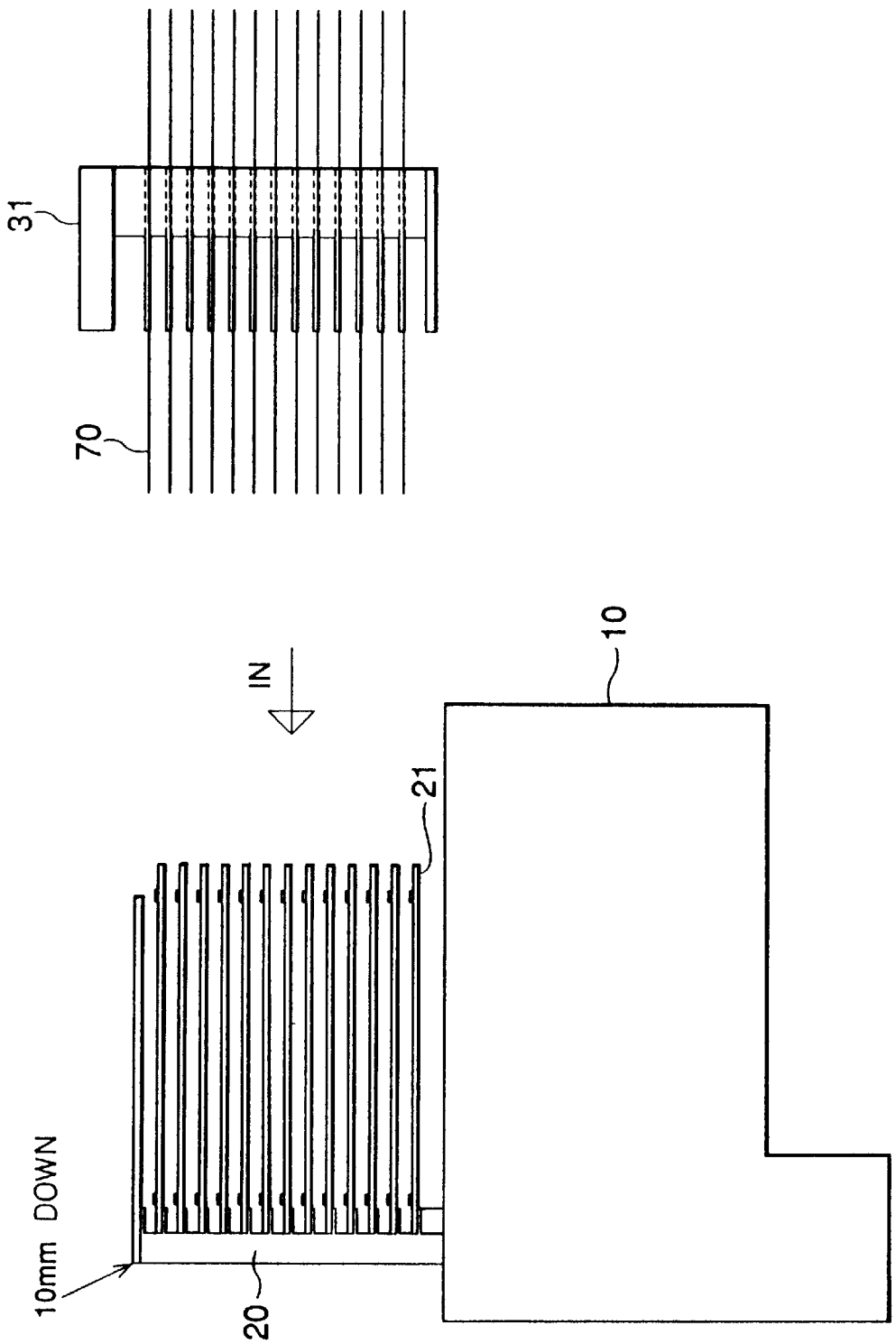
FIG. 11 is a view for use in describing the operation of the vacuum cassette that is associated with the fourth step in FIG. 10.

As shown in FIGS. 10 and 11, after the unloading shuttle cassette 41 has rotated to the standby position, the loading shuttle cassette 31 that was on standby in FIG. 5 moves to the wafer receiving position.

Figure 12:
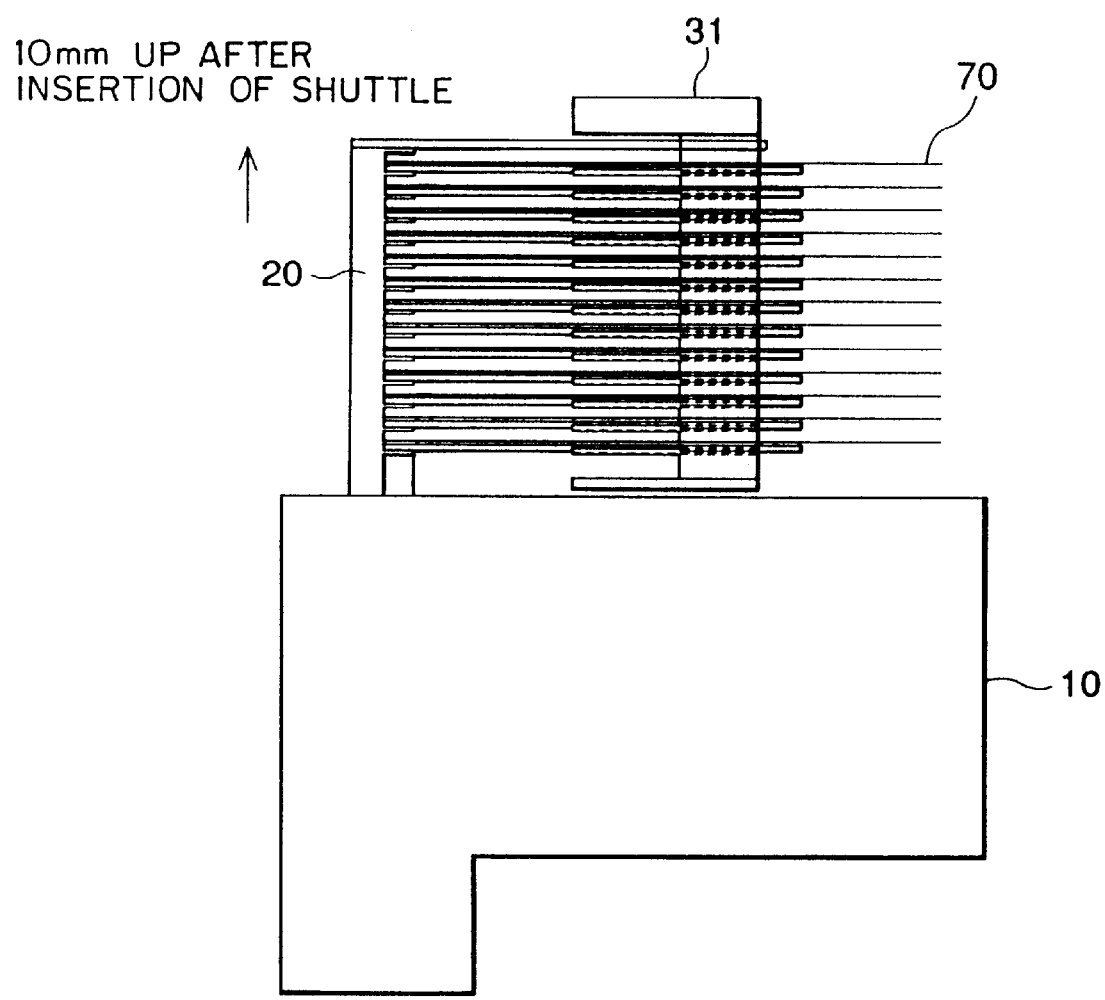
FIG. 12 is a view for use in describing the operation of the vacuum cassette that is associated with the operation in FIG. 11.

As shown in FIG. 12, when the vacuum cassette 20 moves up 10 mm, the vacuum cassette 20 takes up the unprocessed wafers 70 of thirteen from the loading shuttle cassette 31 all at once.

Figure 13:
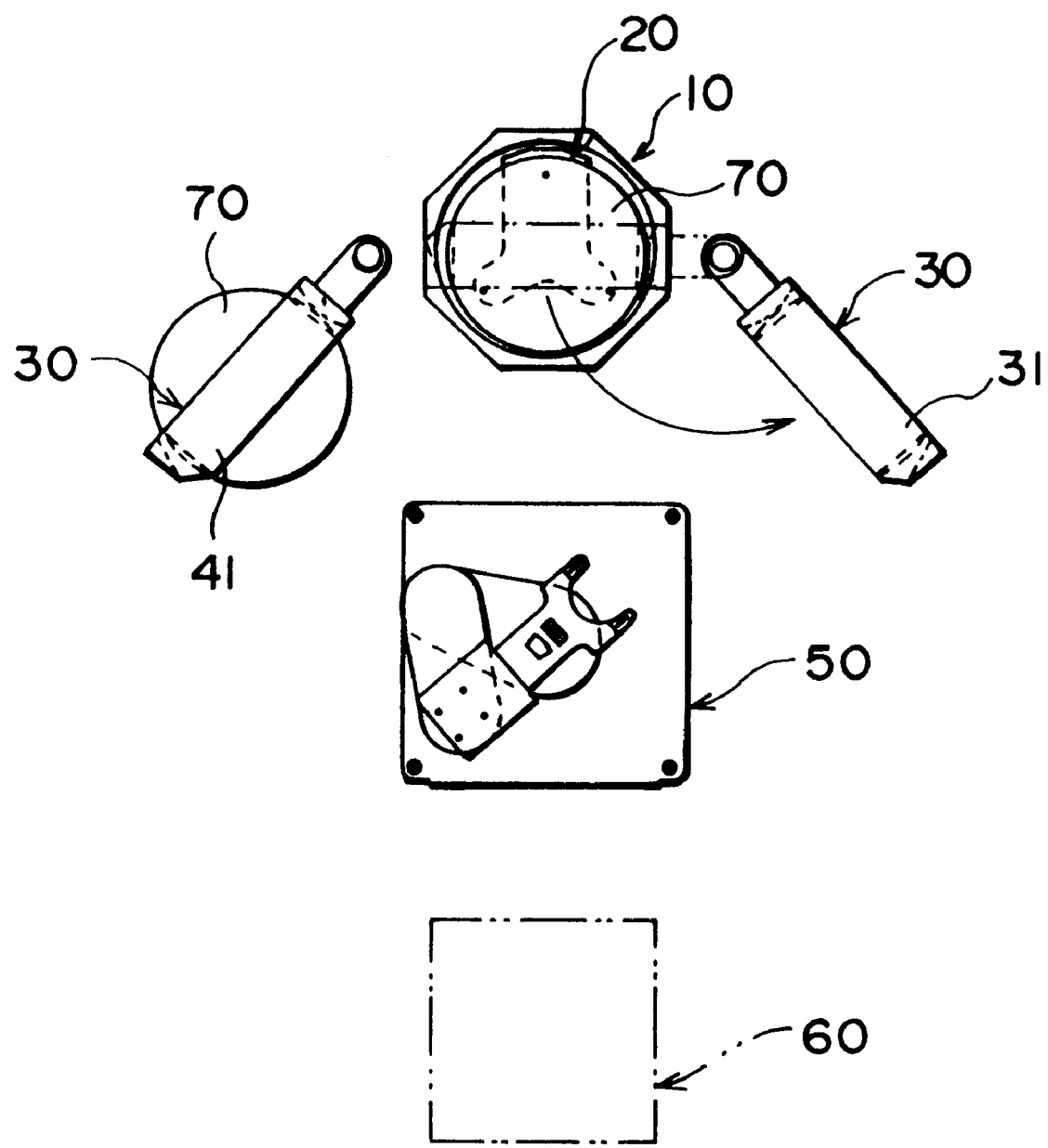
FIG. 13 is a view for use in describing a fifth step of the operation of the wafer transport apparatus according to the present invention.
Figure 14:
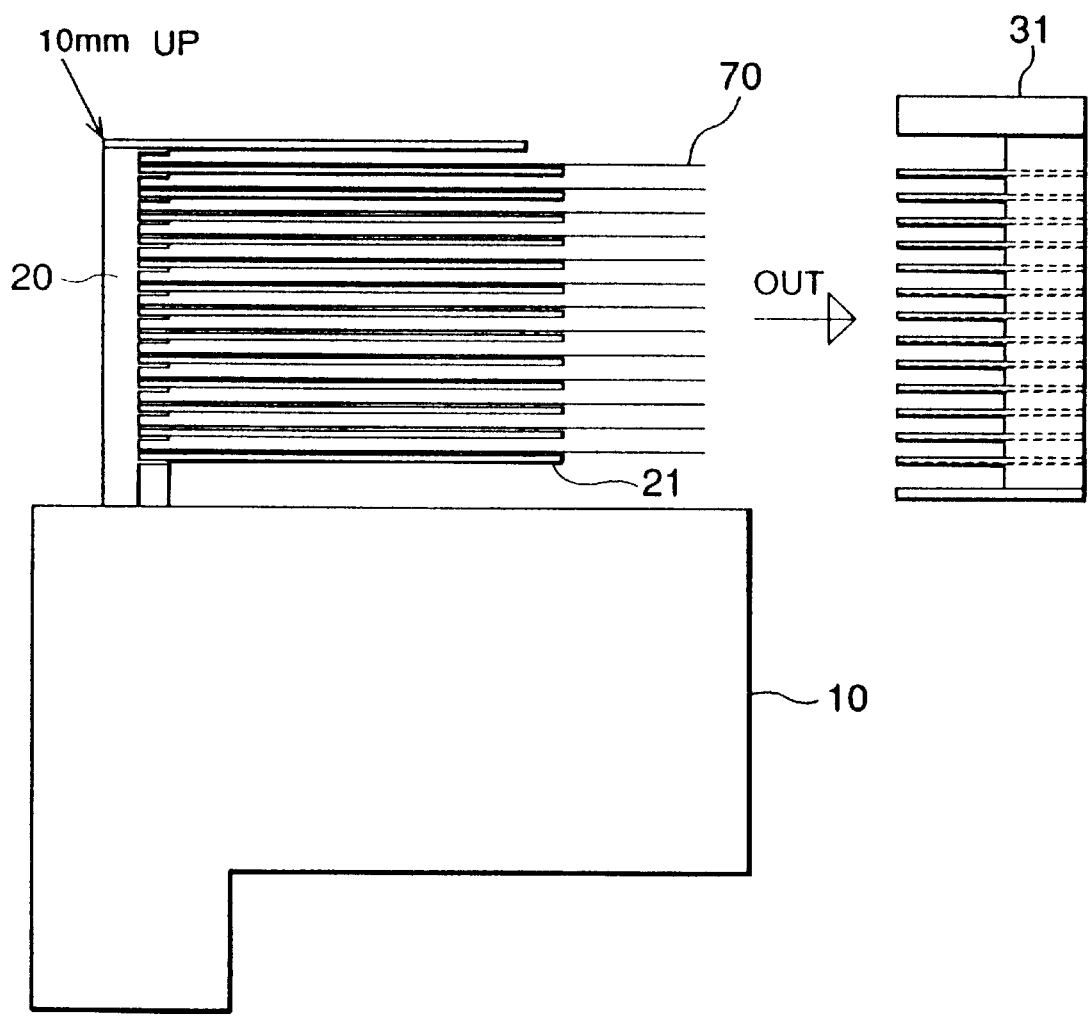
FIG. 14 is a view for use in describing the operation of the vacuum cassette that is associated with the fifth step in FIG. 13.

As shown in FIGS. 13 and 14, the loading shuttle cassette returns to the standby position.

After this, the vacuum cassette 20 that has taken up the unprocessed wafers 70 of thirteen is moved inside the vacuum chamber 10. Next, they are transferred from the vacuum cassette 20 to the ion implantation position in the vacuum chamber 10, and ion implantation processing recommences.

Figure 15:
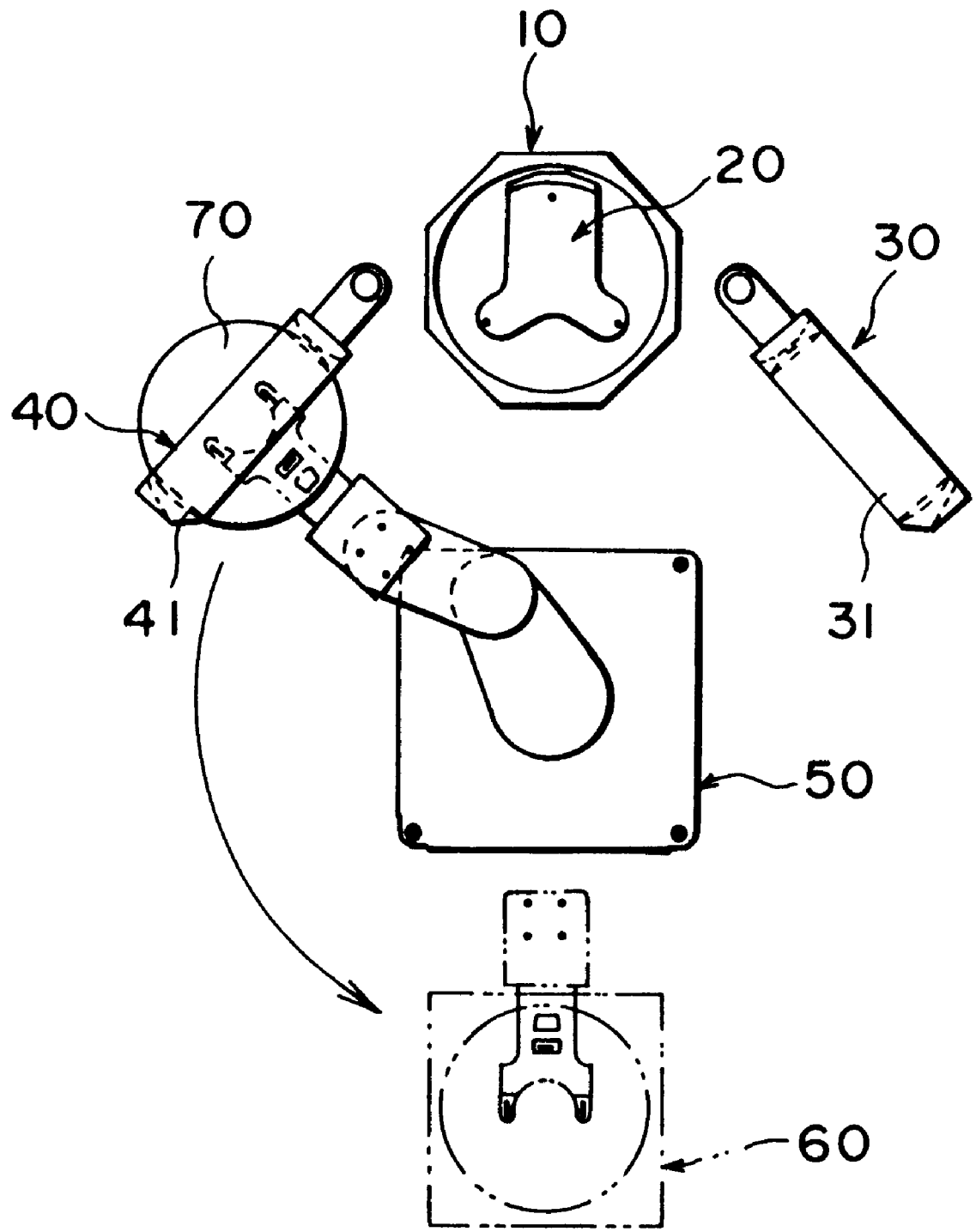
FIG. 15 is a view for use in describing a sixth step of the operation of the wafer transport apparatus according to the present invention.

As shown in FIG. 15, the processed wafers 70 of thirteen in the unloading shuttle cassette 41 are transferred to the wafer cassette unit 60 by the handling unit 50. In addition the handling unit 50 loads unprocessed wafers 70 of thirteen from a new wafer cassette into the loading shuttle cassette 31. Afterwards, the shuttle cassette 31 is put on standby.

In the above, it has been described to use the present invention in a desirable example of use in the a wafer transport apparatus for ion implantation equipment in the case of batch processing for 12 inch wafers of thirteen, but any wafer size and number are possible. The number of wafer supports and the size of the supports can be changed according to wafer number and size.

An example of rotation of the shuttle cassettes 31 and 41 between the transfer position for transferring wafers to and from the vacuum cassette 20 and the standby position separated from it was given, but any means can be used for moving between the transfer position and the standby position.

Using the example of 12 inch wafers of thirteen, the exchange time of 104 seconds (8 seconds per wafer) for a conventional system can be reduced to approximately 10 seconds using the present invention. Thus, the processing capacity per unit time duration is improved in the case of short ion implantation time duration.

What is claimed is:

1. A wafer transport apparatus that transfers wafers all at once to and from wafer holding racks in a cassette unit provided in ion implantation equipment for batch processing, wherein:

said wafer transport apparatus comprises a loading shuttle unit for loading said wafers and an unloading shuttle unit for unloading them, said loading and said unloading shuttle units being arranged with said cassette unit therebetween;

each of said loading and said unloading shuttle units being equipped with shuttle cassettes, each with wafer supports corresponding to the wafer holding racks;

said shuttle cassettes being configured so that movement between a transfer position for transferring wafers to and from said cassette unit and a standby position separated from said transfer position is possible;

said wafer holding racks supporting said wafers in a central area of said wafer, each of said wafer supports supporting said wafer on both sides along the diameter of said wafer at points away from said central area.

2. A wafer transport apparatus as claimed in claim 1, wherein each of said wafer supports has receptions in two positions corresponding to positions separated from said central area on both sides along a diameter of said wafer, said receptions having tapered surfaces that incline downward from an outside to an inside of said wafer, thereby positioning said wafer just by loading said wafer on said receptions.

3. A wafer transport apparatus as claimed in claim 2, wherein said cassette unit is set up to freely enter and exit a vacuum chamber, and the transferring of multiple wafers is carried out with said cassette unit removed out of said vacuum chamber.

4. A wafer transport apparatus as claimed in claim 3, wherein said wafer holding racks are configured so they can move freely only a predetermined fixed distance up and down, and when unprocessed wafers are transferred to said cassette unit from said wafer loading shuttle unit all at once, said wafer holding racks are in a position moved downward just said predetermined fixed distance, and if said wafer supports come to a receiving position, said wafer holding racks are raised just said predetermined fixed distance and take said unprocessed wafers all at once, thereby allowing reception of said unprocessed wafers by said wafer supports all at once.

5. A wafer transport apparatus as claimed in claim 4, wherein said wafer holding racks are positioned by being moved up just said predetermined fixed distance when multiple processed wafers are transferred to said wafer unloading shuttle unit from said cassette unit in a batch, and said processed wafers are transferred to said wafer supports all at once by just lowering said wafer holding racks by said predetermined fixed distance when said wafer supports come to said transfer position.

6. A wafer transport apparatus as claimed in claim 5, further comprising a handling unit, said handling unit transferring said unprocessed wafers all at once to said wafer loading shuttle unit in said standby position and receiving said processed wafers all at once from said wafer unloading shuttle unit in said standby position.

* * * * *